(12) United States Patent
Pao

(10) Patent No.: US 8,365,500 B2
(45) Date of Patent: *Feb. 5, 2013

(54) OPTIMIZED BUILDING INTEGRATED HYBRID ROOFING SYSTEM

(76) Inventor: Frank Pao, Boston, MA (US)

( * ) Notice: Subject to any disclaimer, the term of this patent is extended or adjusted under 35 U.S.C. 154(b) by 31 days.

This patent is subject to a terminal disclaimer.

(21) Appl. No.: 12/976,258

(22) Filed: Dec. 22, 2010

(65) Prior Publication Data

US 2012/0159878 A1 Jun. 28, 2012

(51) Int. Cl.
*E04B 1/00* (2006.01)
*E04B 7/02* (2006.01)
*E04H 14/00* (2006.01)

(52) U.S. Cl. .................. 52/747.1; 52/90.1; 52/173.3

(58) Field of Classification Search ............ 52/90.1, 52/173.3
See application file for complete search history.

(56) References Cited

U.S. PATENT DOCUMENTS

| | | | |
|---|---|---|---|
| 4,014,152 A | 3/1977 | Vallee |
| 4,033,081 A | 7/1977 | Perkins |
| 4,058,950 A | 11/1977 | Vallee |
| 4,089,145 A | 5/1978 | DeVries, Jr. |
| 4,106,253 A | 8/1978 | Aarons |
| 4,174,703 A | 11/1979 | Blakey |
| 4,189,881 A | 2/1980 | Hawley |
| 4,201,193 A | 5/1980 | Rone |
| 4,202,319 A | 5/1980 | Vinz |
| 4,204,520 A | 5/1980 | Rosenberg |
| 4,228,791 A | 10/1980 | Hirai |
| 4,426,823 A | 1/1984 | Kobe |
| 4,470,406 A | 9/1984 | Rinklake |
| 4,738,247 A | 4/1988 | Moore |
| 4,860,509 A | 8/1989 | Laaly |
| 4,860,511 A | 8/1989 | Weisner |
| 4,958,471 A | 9/1990 | Waddington |
| 5,112,408 A | 5/1992 | Melchoir |
| 5,232,518 A | 8/1993 | Nath |
| 5,259,363 A | 11/1993 | Peacock |
| 5,409,549 A | 4/1995 | Mori |
| 5,437,735 A | 8/1995 | Younan |
| 5,460,164 A | 10/1995 | Rekstad |
| 5,471,807 A | 12/1995 | Vasquez |
| 5,590,495 A | 1/1997 | Bressler |
| 5,791,112 A | 8/1998 | Plum |
| 5,794,396 A | 8/1998 | Gibbs |
| 5,990,414 A | 11/1999 | Posnansky |
| 6,000,393 A | 12/1999 | Moore |
| 6,065,255 A | 5/2000 | Stern |
| 6,269,596 B1 | 8/2001 | Ohtsuka |
| 6,295,818 B1 | 10/2001 | Ansley |
| 6,323,478 B1 | 11/2001 | Fujisaki |
| 6,393,796 B1 | 5/2002 | Goettl |

(Continued)

*Primary Examiner* — Mark Wendell
(74) *Attorney, Agent, or Firm* — Michael N. Cohen; Cohen IP Law Group, P.C.

(57) ABSTRACT

An optimized building integrated hybrid roofing system is disclosed. The system comprises a plurality of metal battens having a longitudinal channel mounted horizontally onto a plurality of wooden battens, a plurality of solar electric roof tiles mounted on the metal battens and connected in series to form a string, a thermal tubing/heat pipe mounted along the longitudinal channel, at least one manifold containing liquid connected with the thermal tubing/heat pipe, an inverter connected to each string, heat exchangers connected to the thermal tubing/heat pipe, and a pump connected between the thermal tubing/heat pipe and the heat exchangers. The solar electric roof tiles generate DC from solar energy and the inverter converts the DC to AC to feed to a utility grid. The metal battens collect solar energy and converts into thermal energy resulting in producing hot water.

16 Claims, 8 Drawing Sheets

U.S. PATENT DOCUMENTS

| | | |
|---|---|---|
| 6,463,708 B1 | 10/2002 | Anderson |
| 6,498,289 B1 | 12/2002 | Mori |
| 6,606,830 B2 | 8/2003 | Nagao |
| 6,875,914 B2 | 4/2005 | Guha |
| 7,012,188 B2 | 3/2006 | Erling |
| 7,299,591 B2 | 11/2007 | Broach |
| D600,638 S | 9/2009 | Plaisted |
| 2005/0000172 A1 | 1/2005 | Anderson |
| 2006/0005507 A1 | 1/2006 | Chillington |
| 2006/0124276 A1 | 6/2006 | Curtis |
| 2007/0157963 A1 | 7/2007 | Metten |
| 2008/0083176 A1 | 4/2008 | Barsun |
| 2008/0141999 A1 | 6/2008 | Hanken |
| 2008/0302031 A1 | 12/2008 | Bressler |
| 2009/0223550 A1 | 9/2009 | Curtin |
| 2011/0138710 A1* | 6/2011 | Reisdorf et al. ............. 52/173.3 |

* cited by examiner

OPTIMIZED BUILDING INTEGRATED HYBRID ROOFING SYSTEM

CROSS-REFERENCE TO RELATED APPLICATIONS

Not Applicable.

STATEMENT REGARDING FEDERALLY SPONSORED RESEARCH AND DEVELOPMENT

Not Applicable.

FIELD OF THE INVENTION

This invention relates to a building integrated roofing system, and more particularly to an optimized building integrated hybrid roofing system.

DISCUSSION OF RELATED ART

Many countries are searching for solutions to global warming and its potential consequences. One important way to reduce global warming is to use alternative or renewable energy, such as, solar energy which is environmentally friendly and can be more cost-effective in the long run than many other methods. A properly sized and installed solar thermal energy collection system can be a practical alternative for acquiring energy needs in many areas of the world.

Solar panels are used to generate electricity by converting the sun's energy into electricity. These solar panels are comprised of photovoltaic cells arranged on a flat grid. For example, U.S. Pat. No. 5,990,414 issued to Posnansky on Nov. 23, 1999 discloses a photovoltaic solar roof consisting of roofing elements made of fiber cement upon which solar cells are mounted. Though the photovoltaic solar roof can be laid by a roofer with no electrotechnical expertise, the conversion rate goes down when the ambient temperature on the roof goes 85 degree Fahrenheit or above. Some other examples include U.S. Pat. Nos. 5,437,735, 5,232,518, and 6,065,255 and U.S. Patent Application. No. 20070157963 which show a photovoltaic solar roof tile assembly system. These prior art patents are limited to 3 to 4 kw systems on the roof.

The sun's energy can be converted in a variety of different ways. One is converting sun's energy into thermal energy to heat things, such as water. U.S. Pat. No. 4,738,247 issued to Moore on Apr. 19, 1988 provides roof installations consisting of an array of interfitting members e.g. tiles, strips, slats or the like which interfit to form a roof covering and a set of heat pipes which run parallel to the plane of the roof. Heat is extracted from the heat pipes and used directly or indirectly, e.g. via a heat pump apparatus. U.S. Patent Application. No. 20080141999 entitled to Hanken on Jun. 19, 2008 provides a solar heating system for mounting under a roof that includes a panel formed of a sheet material and at least one run of tubing held beneath the panel by a plurality of tubing fasteners. The panel assembly facilitates transfer of the trapped heat from the roof and surrounding air into the fluid circulating through the tubing. Such arrangements will generally not generate sufficient energy to be self-sustaining due to a low conversion rate, and are not aesthetically pleasing.

U.S. Pat. No. 5,259,363 issued to Peacock on Nov. 9, 1993 teaches a solar roofing panel system for use in residential and commercial buildings employing conventional metal roofing components. The system collects and supplies thermal energy from the sun to heat the interior thereof and is also capable of providing solar generated electricity for powering the normal complement of household appliances. However the system produces both thermal and electrical energy, but cannot produce them simultaneously to work in conjunction with or compensate for each other.

Therefore, there is a need for a thermal electric hybrid roofing system that eliminates the is problem of degradation of the conversion rate when the ambient temperature on the roof goes beyond 85 degree Fahrenheit. The thermal electric hybrid roofing system would be connected to a heat exchanger that goes to a ground system which could be a large tank or horizontal loops to heat up the ground system. The ground system captures the solar thermal energy throughout the year and stores it to produce a self-sustaining energy system for a building. Further, such a device would utilize thermal tubing/heat pipe to substantially increase the energy conversion efficiency which would allow buildings in northern climates to be totally self-sustaining. In addition, such system would also cool the roof substantially reducing the air conditioning cost in the summer months. Such a needed device would simultaneously generate thermal energy and more than 4 kw of electrical power. The present invention accomplishes these objectives.

SUMMARY OF THE INVENTION

The present invention is an optimized building integrated hybrid roofing system comprises a plurality of metal battens mounted horizontally onto a plurality of wooden battens that mounted vertically across a roof. Each of the plurality of metal battens includes a longitudinal channel that extends in a longitudinal direction on a pair of opposing sides thereof. A thermal tubing/heat pipe extends along the longitudinal channels and mounted to each of the plurality of metal battens. The thermal tubing/heat pipe is connected with at least one manifold that contains circulating liquid. A plurality of solar electric roof tiles is mounted on the plurality of metal battens, each of the plurality of solar electric roof tiles connected in series to form a string.

An inverter is connected to each string for converting DC electricity that fed from the plurality of solar electric roof tiles to AC electricity. The thermal tubing/heat pipe is connected to a plurality of heat exchangers and a pump is connected between the thermal tubing/heat pipe and the plurality of heat exchangers for circulating the liquid through the at least one manifold. The thermal tubing/heat pipe mounted with the plurality of solar electric roof tiles optimizes the capturing of the solar energy as well as minimizes lose of thermal energy in winter months.

The plurality of solar roof tiles is connected to the plurality of metal battens using a storm anchor hook which is designed in such a way that the plurality of solar roof tiles overlaps each other. The metal batten alone holds the thermal system (thermal tubing/heat pipe) and the plurality of solar electric roof tiles. The system may further optimize heat transfer on the roof by horizontally embedding the thermal tubing/heat pipe at an overlapping part of the solar electric roof tiles instead of the plurality of metal battens.

The plurality of solar roof tiles generates DC electricity as the solar energy hits a surface of the plurality of solar roof tiles. The inverter converts the DC electricity to AC electricity and feeds to a utility grid or the inverter can store the DC on the batteries. A photovoltaic module powers a DC pump and both the DC pump and the plurality of solar electric roof tiles converts the solar energy into thermal energy thereby heating the thermal tubing/heat pipe. At least one manifold connected to the thermal tubing/heat pipe circulates the liquid or glycol to extract the thermal energy down to a plurality of heat exchangers and a ground system resulting in circulation of cold water to generate domestic hot water and heating up the domestic hot water supply.

DETAILED DESCRIPTION OF THE PREFERRED EMBODIMENT

Figure 1:
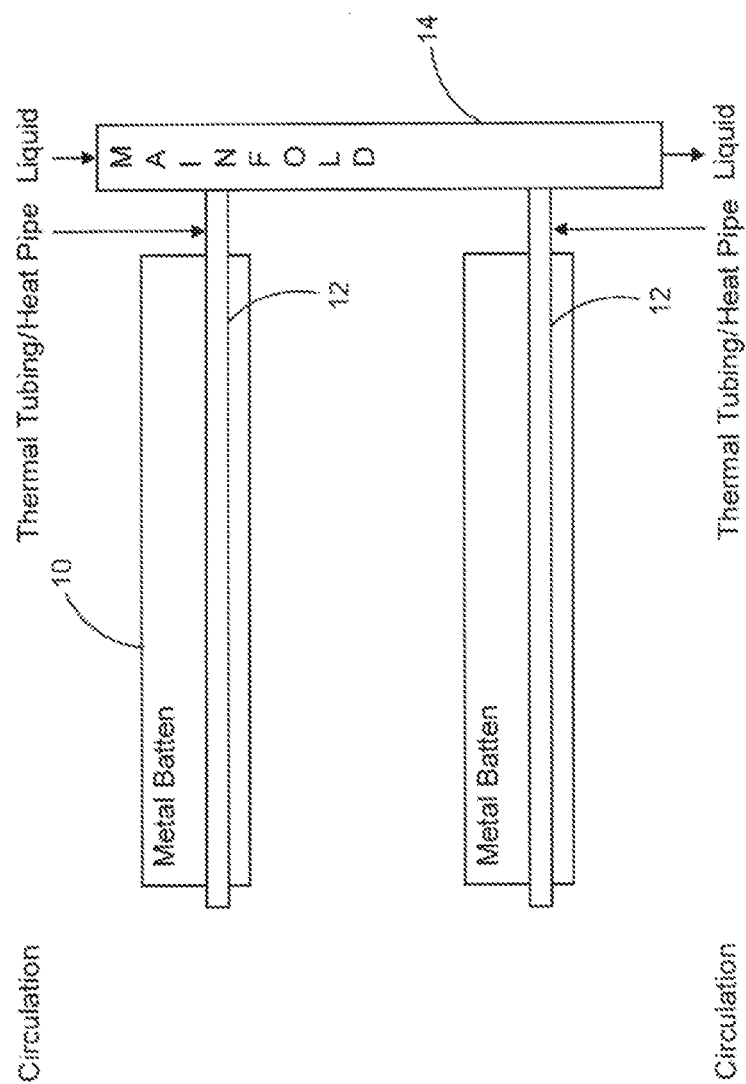
FIG. 1 illustrates a plurality of metal batten mounted with a thermal tubing/heat pipe in accordance with the present invention.

Referring to FIG. 1, each of a plurality of metal batten 10 is mounted with a thermal tubing/heat pipe 12. The plurality of metal battens 10 is mounted horizontally onto a plurality of wooden battens (not shown) that mounted vertically across a roof. Each of the plurality of metal battens 10 includes a longitudinal channel (not shown) that extends in a longitudinal direction on a pair of opposing sides thereof. A plurality of solar electric roof tiles (not shown) is mounted on the plurality of metal battens 10, each of the plurality of solar electric roof tiles (not shown) connected in series to form a string. The thermal tubing/heat pipe 12 extends along the longitudinal channels (not shown) and mounted to each of the plurality of metal battens 10.

The thermal tubing/heat pipe 12 is connected with at least one manifold 14 which contain circulating liquid or glycol that would be circulated in transferring the thermal energy to be used for domestic hot water and store for later usage which could result in making the house or building totally energy independent. The thermal tubing/heat pipe 12 may be easier to install and capture more solar energy from the roof. The solar energy is transferred and is used in domestic hot water as well as storing the energy for later applications. The circulation liquid or glycol may transfer to thermal energy through heat exchangers for domestic hot water and storing the energy in the warm seasons.

Figure 2:
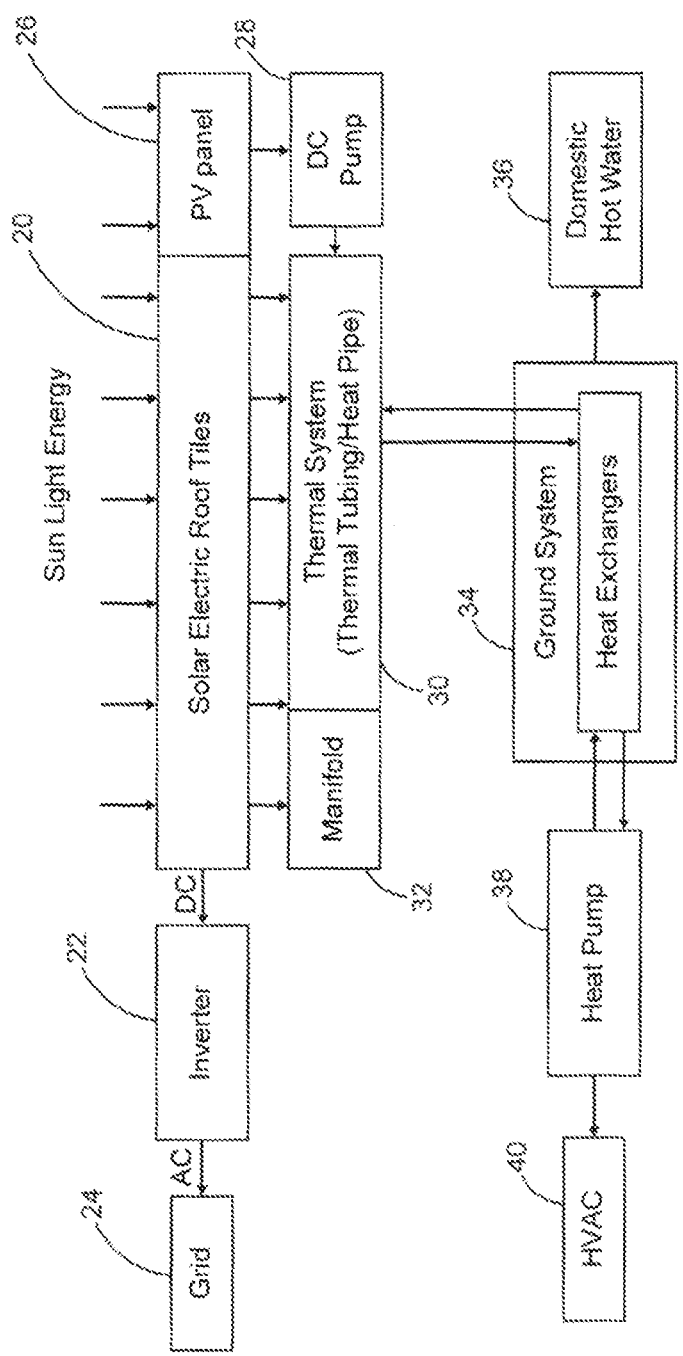
FIG. 2 is a block diagram of an optimized building integrated hybrid roofing system in accordance with the present invention.

FIG. 2 illustrates a block diagram of an optimized building integrated hybrid roofing is system in accordance with the present invention. As the solar energy hits a surface of a plurality of solar electric roof tiles, the plurality of solar roof tiles generates DC electricity as indicated at block 20. The inverter converts the DC electricity to AC electricity as indicated at block 22 and feeds to a utility grid as indicated at block 24 or it could store the DC on the batteries. In addition, a photovoltaic module as indicated at block 26 power a DC pump as indicated at block 28. The DC pump and the plurality of solar electric roof tiles converts the solar energy into thermal energy thereby heating up a thermal tubing/heat pipe as indicated at block 30. At least one manifold connected to the thermal tubing/heat pipe circulates the liquid or glycol as indicated at block 32 thereby the thermal tubing/heat pipe extracts the thermal energy down to a plurality of heat exchangers and a ground system resulting in circulation of cold water as indicated at block 34 to generate domestic hot water and heating up the domestic water supply as indicated at block 36. The ground system may be a large tank or horizontal loops. At least one heat exchanger of the plurality of heat exchangers would be connected to a heat pump as indicated at block 38 to handle the HVAC as indicated at block 40.

The photovoltaic module attached to the plurality of solar electric roof tiles helps in the independent working of the thermal system (thermal tubing/heat pipe) in case of technical problems in the electric system which could prevent the thermal system (thermal tubing/heat pipe) from operating. Another advantage of using the photovoltaic module is that the liquid or glycol flowing through the at least one manifold could vary according to the intensity of the solar energy which results in extracting more heat. If more heat is extracted from the roof, the attic cools off to generate more domestic hot water and the is plurality of solar electric roof tiles cools off to reduce the air conditioning load.

Figure 3:
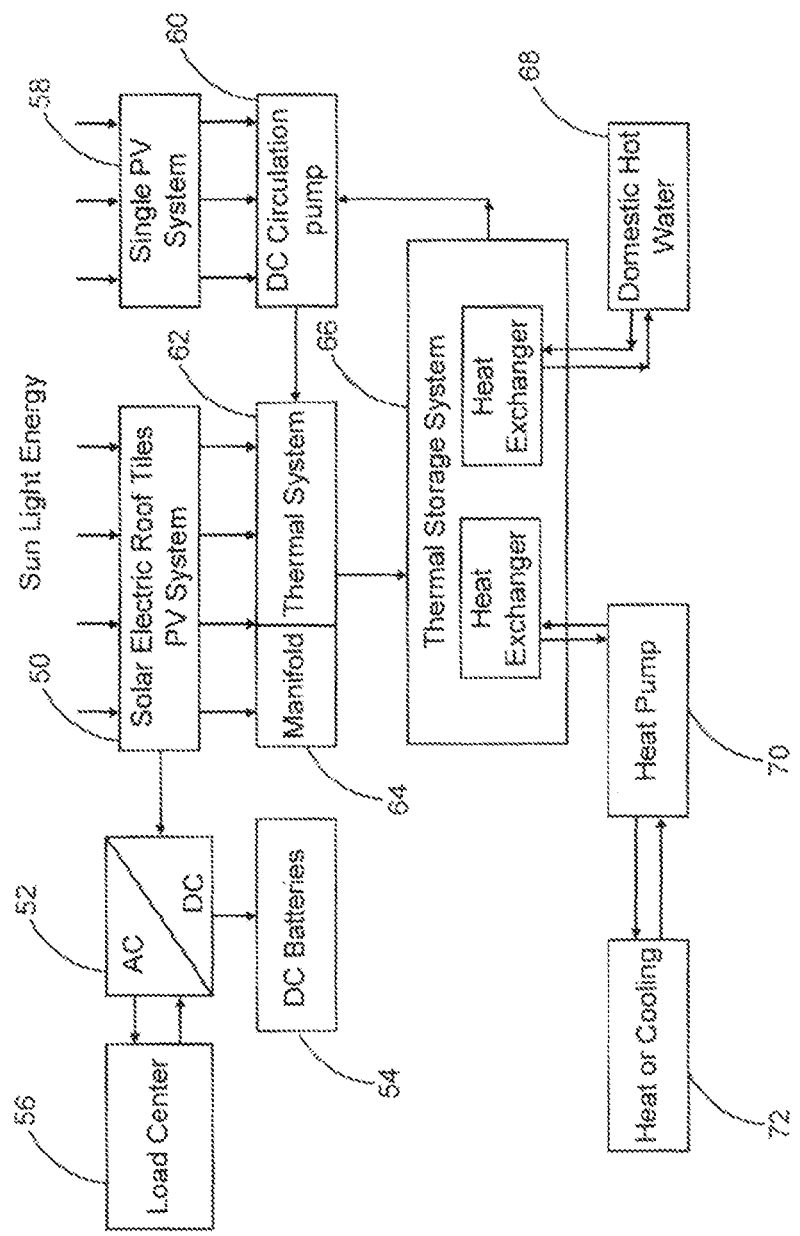
FIG. 3 is a block diagram of the optimized standalone building integrated hybrid roofing system using DC appliance in accordance with the present invention.

FIG. 3 illustrates a block diagram of an optimized standalone building integrated hybrid roofing system using DC appliance in accordance with the present invention. As the solar energy hits a surface of the plurality of solar electric roof tiles, the plurality of solar electric roof tiles integrated with a photovoltaic panel system as indicated at block 50 and generates DC electricity and AC electricity as indicated at block 52. The DC electricity could store the DC on the batteries as indicated at block 54. A load center distributes AC electricity and DC electricity as indicated at block 56. In addition, a single photovoltaic system as indicated at block 58 powers a DC circulation pump as indicated at block 60.

The DC circulation pump and the plurality of solar electric roof tiles converts the solar energy into thermal energy thereby heating up a thermal tubing/heat pipe as indicated at block 62. At least one manifold connected to the thermal tubing/heat pipe circulates the liquid or glycol as indicated at block 64 thereby the thermal tubing/heat pipe extracts the thermal energy down to the plurality of heat exchangers resulting in circulation of cold water as indicated at block 66 to generate domestic hot water and heating up the domestic water supply as indicated at block 68. At least one heat exchanger of the plurality of heat exchangers would be connected to a heat pump as indicated at block 70 for heating or cooling of domestic water as indicated at block 72.

Figure 4:
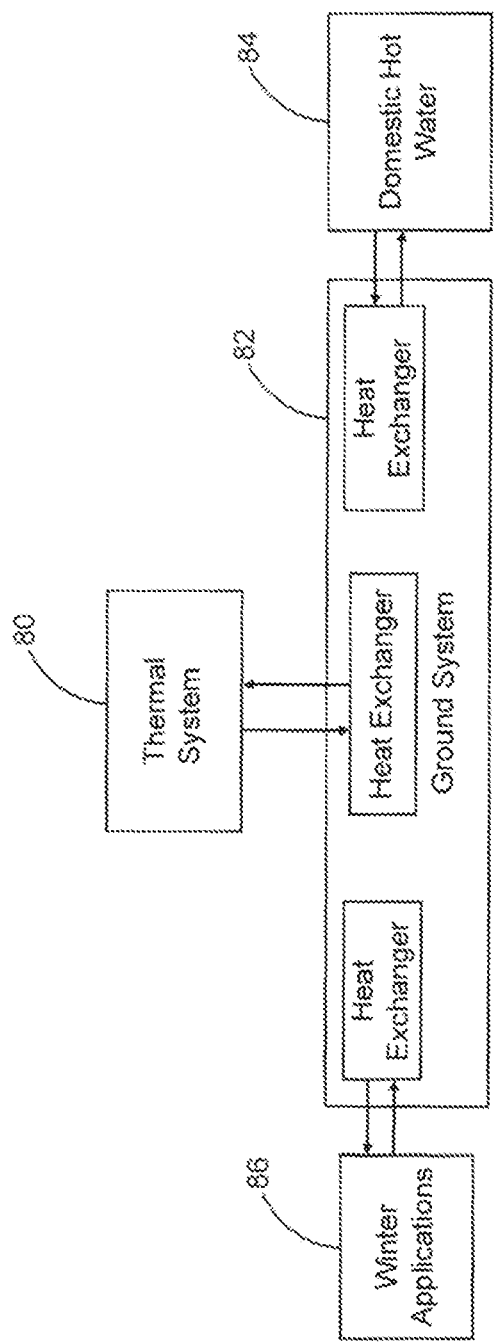
FIG. 4 is a block diagram illustrating an operation of a ground system to make a building self sustaining.

FIG. 4 is a block diagram illustrating the operation of the ground system to make a is building self sustaining. The thermal tubing/heat pipe that are mounted with the plurality of a solar electric roof tiles optimize the capturing of the solar energy and transfers to the ground system as indicated at block 80. The ground system captures the solar thermal energy throughout the year and stores it to make the building totally sustaining as indicated at block 82. The thermal tubing/heat pipe minimizes the lost of thermal energy in the winter months. The captured thermal energy results in the circulation of cold water to generate domestic hot water and heating up the domestic water supply as indicated at block 84. The stored thermal energy can be used for winter applications as indicated at block 86. In addition, it also cools the roof which results in reduction of the air conditioning cost in the summer months.

Figure 5:
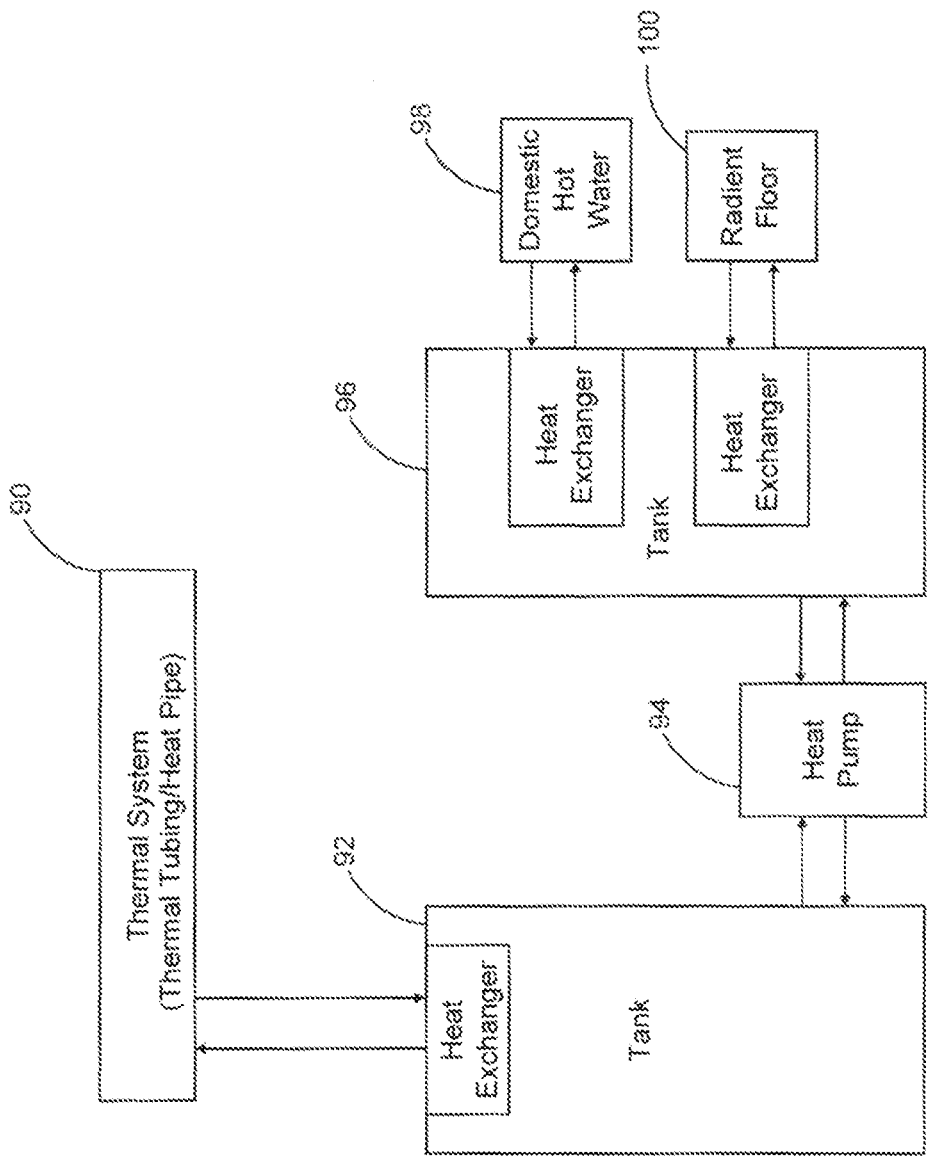
FIG. 5 is a block diagram illustrating an operation for optimizing the extraction of the solar thermal and storage system.

FIG. 5 is a block diagram illustrating an operation for optimizing the extraction of the solar thermal and storage system. The thermal system that includes the thermal tubing/heat pipe as shown in block 90 is connected to a tank having a heat exchanger so that the heat exchanger can heat the water in the tank as indicated at block 92. Meanwhile, a heat pump as indicated in block 94 is connected to the tank and extracts the thermal energy from the tank and transfer the thermal energy to other tank as indicated in block 96, wherein the other tank can obtain the thermal energy for domestic hot water as indicated at block 98 and radiant floor heat as indicated at block 100.

FIG. 5 is a flow chart illustrating a method of mounting an optimized building integrated hybrid roofing system 200. As shown in step 202 the plurality of metal battens are is mounted horizontally onto the plurality of wooden battens that mounted vertically across a roof. Each of the plurality of metal battens includes a longitudinal channel that extends in a longitudinal direction on a pair of opposing sides thereof. Then, least one manifold is mounted on one side of the roof as shown in step 204. After mounting the manifold, a thermal tubing/heat pipe is mounted along the longitudinal channel in a longitudinal direction and connected onto the at least one manifold as shown in step 206. As shown in step 208, a first row of the plurality of solar electric roof tiles is installed on the plurality of metal battens using a storm anchor hook which is hammered into a hole provided in each of the plurality of metal battens. A second row of the plurality of solar electric roof tiles is installed in such a way that the tiles overlaps with the first row of the plurality of solar electric roof tiles as shown in step 210. After the step 210, each of the plurality of solar electric roof tiles is connected in series to form a string as shown in step 212. As shown in step 214, an inverter is connected to each string for converting the DC electricity that fed from the plurality of solar electric roof tiles to AC electricity. As shown in step 216, a plurality of heat exchangers is connected to the thermal tubing/heat pipe for extracting the thermal energy. After the step 216, at least one heat exchanger is connected to a heat pump to handle HVAC as shown in step 218. A heat pump is connected between the at least one manifold and the at least one heat exchanger for circulating the liquid running through the at least one manifold as shown in step 220.

Figure 6A:
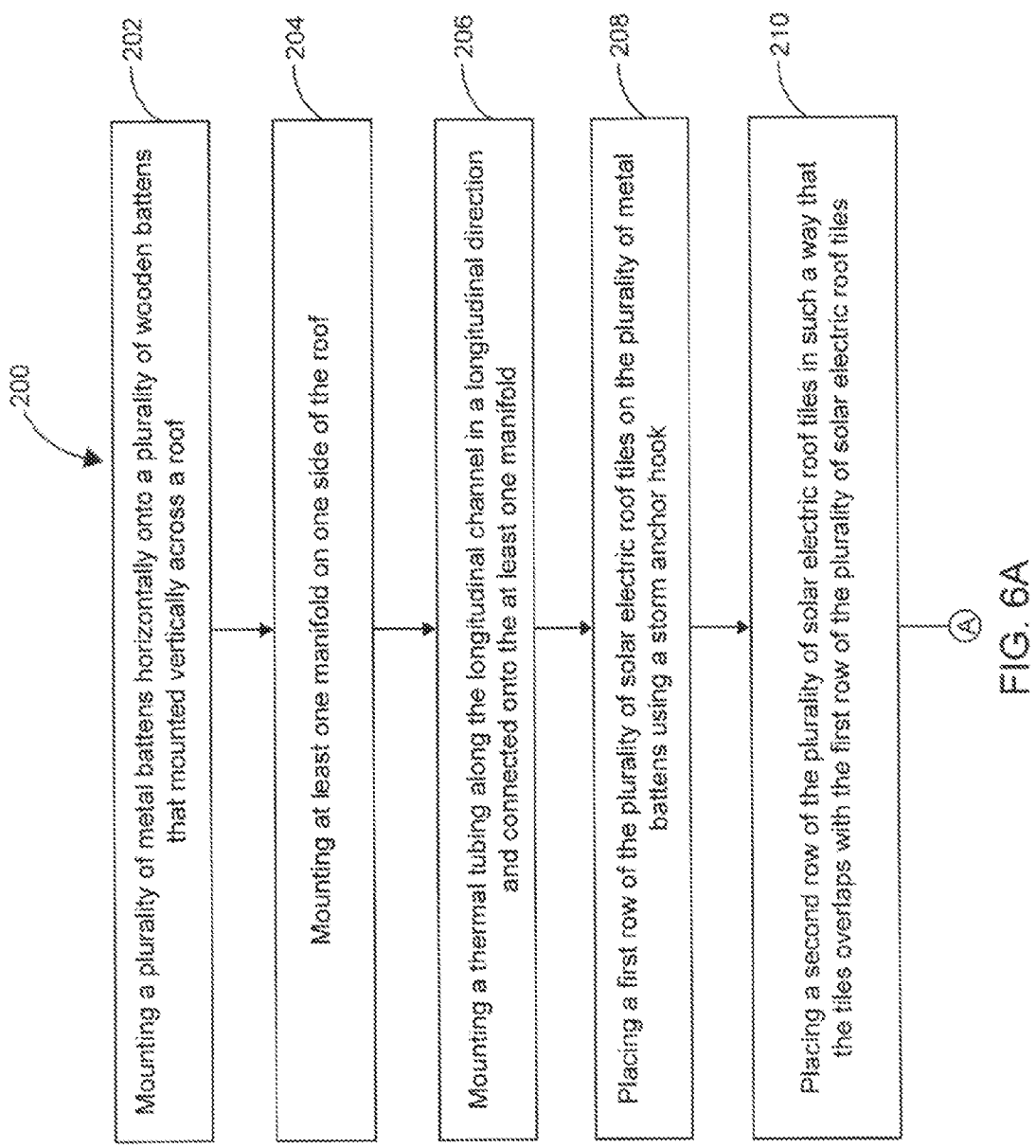
FIG. 6 is a flow chart illustrating a method of mounting an optimized building integrated hybrid roofing system in accordance with the present invention.
Figure 6B:
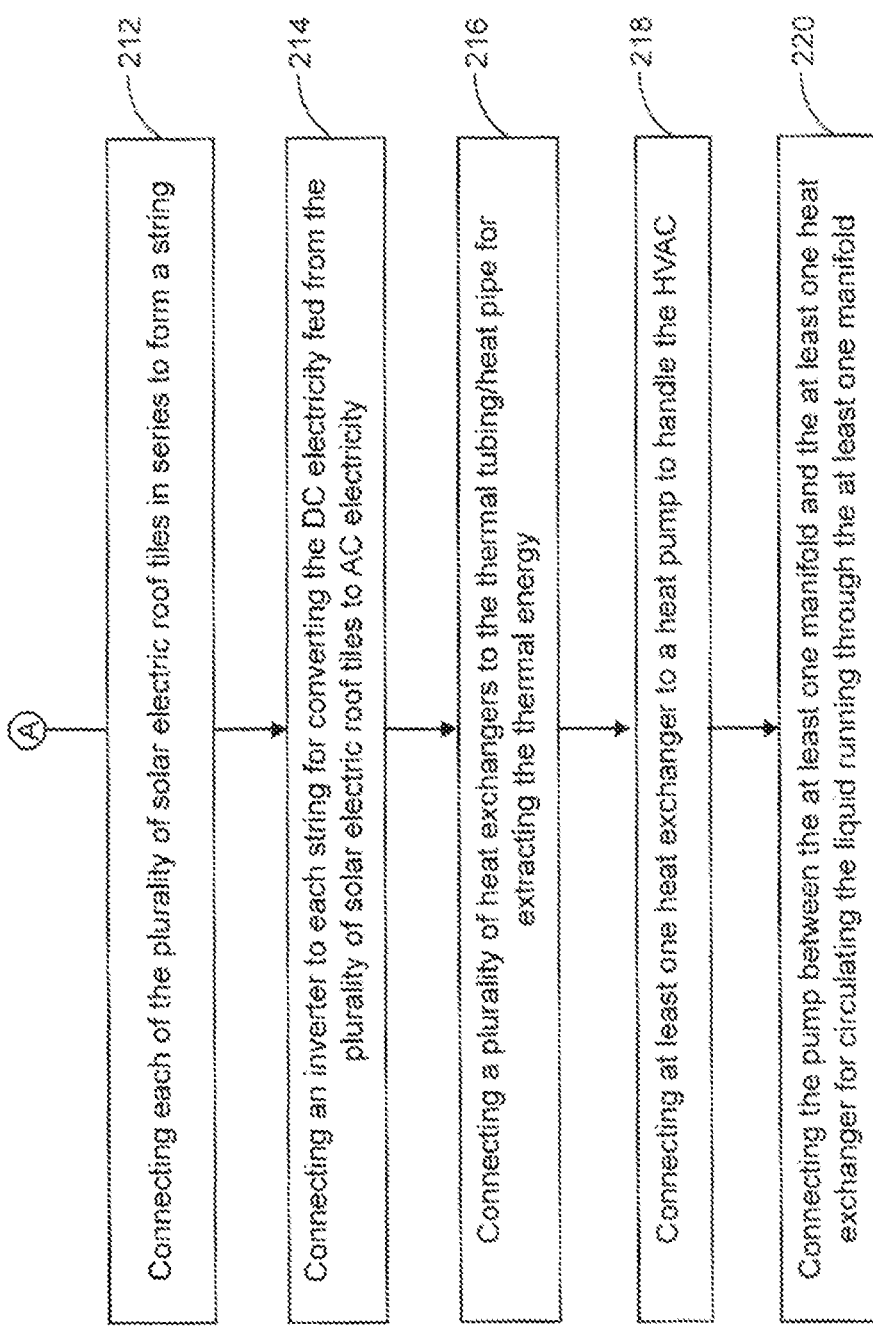
Figure 7:
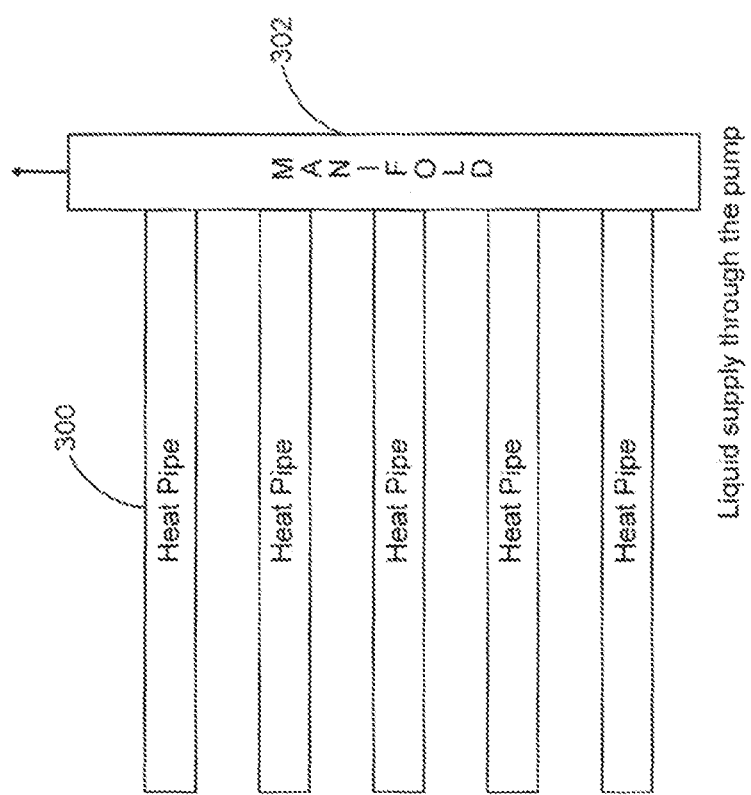
FIG. 7 illustrates a thermal tubing/heat pipe embedded at an overlapping part of a plurality of solar electric roof tiles provided with another embodiment of the present invention.

FIG. 6 illustrates a thermal tubing/heat pipe embedded at an overlap of a plurality of solar electric roof tiles provided with another embodiment of the present invention. The thermal tubing/heat pipe 300 is embedded horizontally at an overlapping part of the is plurality of solar electric roof tiles instead of the plurality of metal battens to further optimize heat transfer on the roof. The thermal tubing/heat pipe 300 is connected to the at least one manifold 302 on at least one side of the roof. This arrangement allows the system to further optimize the heat transfer on the roof. Applying the thermal tubing/heat pipe 300 could substantially increase the energy conversion efficiency which would allow buildings in northern climates to be totally self-sustaining.

With the present invention, it is possible to install up to 7 kw systems on the roof. The plurality of metal battens collects the solar energy and converts into thermal energy through running the liquid in the manifold 14 throughout the roof. The thermal energy is extracted down to the heat exchanger resulting in heating up the domestic water supply and providing domestic hot water. As the thermal energy is extracted to the heat exchanger, the plurality of solar electric roof tiles is cooled thereby making the plurality of solar electric roof tiles operate at high efficiency in converting the solar energy to DC electricity. Thus the thermal system (thermal tubing/heat pipe) 12 of the present invention eliminates the problem of degradation of conversion rate of solar energy to electric energy when the ambient temperature on the roof goes beyond 85 degree Fahrenheit. With the present system, the roof becomes aesthetically attractive as the thermal part is not exposed to the exterior.

A storm anchor hook is designed in such a way that the plurality of solar roof tiles overlaps each other. A plurality of holes is drilled in advance on each of the plurality of metal battens 10 according to specified positions which saves time and also simplifies the is installation procedures. The specified positions are based on the size of the plurality of solar electric roof tiles. The each of the plurality of metal battens 10 alone holds the thermal system (thermal tubing/heat pipe) 12 and the plurality of solar electric roof tiles.

The spacing between the each of plurality of metal battens 10 can be varied subject to the size of the plurality of solar electric roof tiles and the required thermal specification. More thermal tubing/heat pipe 12 can be installed to achieve efficiency in high thermal energy conversion, as the plurality of metal battens 10 are more tightly spaced. The main applications of the building integrated hybrid roofing system would be on both commercial and domestic slope roofs. However, the system may also be applied on curtain walls or facades on buildings.

In yet another embodiment, the additional optimization of the system can be achieved by the arrangement of the metal battens. The metal batten mounted with two rows of thermal tubing/heat pipe can be horizontally placed onto wooden batten thereby the metal batten can be prepositioned in order to speed up the installation process. Thus, the arrangement strengthens the total system as well as holds the sunslates to withstand the wind loadable to 125 mph.

While a particular form of the invention has been illustrated and described, it will be apparent that various modifications can be made without departing from the spirit and scope of the invention. For example, the thermal tubing/heat pipe may vary in arrangement and assembly. Accordingly, it is not intended that the invention be limited, is except as by the appended claims.

What is claimed is:

1. An optimized building integrated hybrid roofing system, comprising:
   a plurality of metal battens mounted horizontally onto a plurality of wooden battens that mounted vertically across a roof, each of the plurality of metal battens including a longitudinal channel that extends in a longitudinal direction on a pair of opposing sides thereof;
   at least one manifold containing liquid mounted on one side of the roof;
   connected with each of the thermal tubing/heat pipe;
   a thermal tubing/heat pipe extending on the longitudinal channels, the thermal tubing/heat pipe being mounted to each of the plurality of metal battens and connected onto the at least one manifold; a plurality of solar electric roof tiles mounted on the plurality of metal battens, each of the plurality of solar electric roof tiles connected in series to form a string;
   a photovoltaic module attached to the plurality of solar electric roof tile;
   an inverter connected to each string for converting DC electricity that fed from the plurality of solar electric roof tiles to AC electricity; a plurality of heat exchangers connected to the thermal tubing/heat pipe; and
   a pump connected between the thermal tubing/heat pipe and the plurality of heat exchangers for circulating the liquid through the at least one manifold;
   whereby the thermal tubing/heat pipe sandwiched between the plurality of solar electric roof tiles optimizes the capturing of the solar energy as well as minimizes the lose of thermal energy in winter months.

2. The optimized building integrated hybrid roofing system of claim 1 wherein the system includes a ground system.

3. The optimized building integrated hybrid roofing system of claim 1 wherein the system further optimize heat transfer on the roof by horizontally embedding the thermal tubing/heat pipe at an overlapping part of the solar electric roof tiles instead of the plurality of metal battens.

4. The optimized building integrated hybrid roofing system of claim 1 wherein the plurality of solar roof tiles be a building integrated photovoltaic roof tile having a solar module that glued to an eternit tile.

5. The optimized building integrated hybrid roofing system of claim 1 wherein each of the plurality of solar roof tiles is mounted on the plurality of metal batten using a storm anchor hook which is hammered into a hole provided in each of the plurality of metal battens.

6. The optimized building integrated hybrid roofing system of claim 1 wherein the plurality of solar roof tiles generates DC electricity as the solar energy hits a surface of the plurality of solar roof tiles.

7. The optimized building integrated hybrid roofing system of claim 1 wherein the inverter converts the DC electricity to AC electricity and feeds to a utility grid.

8. The optimized building integrated hybrid roofing system of claim 1 wherein the plurality of metal battens collects the solar energy and converts into thermal energy through running the liquid in the at least one manifold throughout the roof.

9. The optimized building integrated hybrid roofing system of claim 8 wherein the thermal energy is extracted to the heat exchanger resulting in heating up the domestic water supply and providing domestic hot water.

10. The optimized building integrated hybrid roofing system of claim 8 wherein as the thermal energy is extracted to the heat exchanger, the plurality of solar electric roof tiles is cooled thereby making the plurality of solar electric roof tiles operate at high efficiency in converting the solar energy to DC electricity.

11. A method of mounting an optimized building integrated hybrid roofing system, comprising:
 a. mounting a plurality of metal battens horizontally onto a plurality of wooden battens that is mounted vertically across a roof, each of the plurality of metal battens includes a longitudinal channel that extends in a longitudinal direction on a pair of opposing sides thereof;
 b. mounting at least one manifold on one side of the roof;
 c. mounting a thermal tubing/heat pipe to each of the plurality of metal battens by extending along the longitudinal channels and connected onto the at least one manifold;
 d. mounting a first row of a plurality of solar electric roof tiles on the plurality of metal battens using a storm anchor hook which is hammered into a hole provided in each of the plurality of metal battens;
 e. placing a second row of the plurality of solar electric roof tiles overlapping with the first row of the plurality of solar electric roof tiles;
 f. connecting each of the plurality of solar electric roof tiles in series to form a string;
 g. connecting an inverter to each string for converting the DC electricity that fed from the plurality of solar electric roof tiles to AC electricity;
 h. connecting a plurality of heat exchangers to the thermal tubing/heat pipe for extracting the thermal energy;
 i. connecting at least one heat exchanger to a heat pump to handle the HVAC;
 j. connecting the heat pump between the at least one manifold and the at least one heat exchanger for circulating the liquid running through the at least one manifold; and
 k. connecting a photovoltaic module attached to the plurality of solar electric roof tile.

12. The method of claim 11 wherein the plurality of solar electric roof tiles is a building integrated photovoltaic roof tile having a solar module that glued to an eternit tile.

13. The method of claim 11 wherein the plurality of solar electric roof tiles generates the DC electricity as the solar energy hits a surface of the plurality of solar electric roof tiles.

14. The method of claim 11 wherein the thermal tubing/heat pipe is embedded horizontally at an overlapping part of the solar electric roof tiles instead of the plurality of metal battens to further optimize heat transfer on the roof.

15. The method of claim 11 wherein the thermal energy is extracted to the heat exchanger resulting in heating up the domestic water supply and providing domestic hot water.

16. The method of claim 11 wherein as the thermal energy is extracted to the heat exchanger, the plurality of solar electric roof tiles is cooled thereby making the plurality of solar electric roof tiles operate at high efficiency in converting the solar energy to DC electricity.

* * * * *